United States Patent
Kato

(10) Patent No.: US 6,287,929 B1
(45) Date of Patent: Sep. 11, 2001

(54) METHOD OF FORMING A BIPOLAR TRANSISTOR FOR SUPPRESSING VARIATION IN BASE WIDTH

(75) Inventor: Hiroshi Kato, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/639,726

(22) Filed: Aug. 16, 2000

(30) Foreign Application Priority Data

Aug. 19, 1999 (JP) .................................................. 11-232685

(51) Int. Cl.[7] .................................................. H01L 21/331
(52) U.S. Cl. ........................ 438/364; 438/341; 438/369; 438/370
(58) Field of Search ....................... 438/309, 369, 438/370, 320, 341, 348, 384, 365, 377

(56) References Cited

U.S. PATENT DOCUMENTS

| 5,147,810 | * | 9/1992 | Suzuki | 438/362 |
|---|---|---|---|---|
| 5,234,846 | * | 8/1993 | Chu et al. | 438/311 |
| 5,523,614 | * | 6/1996 | Hashimoto | 257/578 |
| 5,766,999 | * | 6/1998 | Satp | 438/309 |
| 5,897,359 | * | 4/1999 | Cho et al. | 438/312 |
| 6,130,136 | * | 10/2000 | Johnson et al. | 438/365 |

FOREIGN PATENT DOCUMENTS

| 4-68536 | | 3/1992 | (JP) | H01L/29/72 |
|---|---|---|---|---|
| 5243507 | * | 9/1993 | (JP) | 257/555 |
| 6-291133 | | 10/1994 | (JP) | H01L/21/331 |
| 7-106341 | | 4/1995 | (JP) | H01L/21/331 |
| 7-307347 | | 11/1995 | (JP) | H01L/21/331 |
| 8-008270 | | 1/1996 | (JP) | H01L/21/331 |
| 9-069528 | | 3/1997 | (JP) | H01L/21/331 |
| 10-335343 | | 12/1998 | (JP) | H01L/29/73 |

OTHER PUBLICATIONS

King et al.; Very Low Cost Graded SiGe Base Bipolar Transistors for a High Performance Modular BiCMOS Process, IEDM 99, 1999, p. 22.4.1–22.4.4.*

* cited by examiner

Primary Examiner—John F. Niebling
Assistant Examiner—Christopher Lattin
(74) Attorney, Agent, or Firm—Hayes, Soloway, Hennessey, Grossman & Hage, PC

(57) ABSTRACT

In accordance with the above first embodiment of the present invention, after a base polysilicon film has been grown, a lump anneal is carried out because of an extremely small variation to the silicon dioxide film. Subsequently, a buffered fluorine acid is used which has a large selective etching ratio of the silicon oxide film to the polysilicon film to side-etch the silicon oxide film in the horizontal direction by a predetermined width before the base impurity $BF^{2+}$ is implanted and then the emitter polysilicon film is formed. For those reasons, a variation in distance between the n+-substrate and a collector is small. The base width "WB" of the base region is not varied, whereby variations in high frequency performance of the bipolar transistor are suppressed.

3 Claims, 13 Drawing Sheets

METHOD OF FORMING A BIPOLAR TRANSISTOR FOR SUPPRESSING VARIATION IN BASE WIDTH

BACKGROUND OF THE INVENTION

The present invention relates to a method of forming a semiconductor device with a self-aligned bipolar transistor.

The conventional method of forming a semiconductor device with a self-aligned bipolar transistor is disclosed in Japanese laid-open patent publication No. 7-307347. A collector layer is surrounded by field oxide films. A first insulation film having a first etching selectivity is deposited on the collector layer. A second conductivity type polysilicon base layer is then deposited on the first insulation film. A second insulation film having a second etching selectivity different from the first etching selectivity of the first insulation film is deposited on the second conductivity type polysilicon base layer. The second insulation film and the second conductivity type polysilicon base layer are selectively etched to form an emitter opening which is positioned at almost center position. A third insulation film having a third etching selectivity different from the first etching selectivity of the first insulation film is entirely deposited. The third insulation film is then subjected to an etch-back, thereby forming first side walls on side walls of the emitter opening. The first insulation film is selectively etched so that a part of a surface of the collector layer is made shown and further a side-etch is made to form a gap having a predetermined depth which is positioned under the second conductivity type polysilicon base layer. A non-selective growth of polysilicon only or amorphous silicon only is carried out to fill the gap. The polysilicon or amorphous silicon is then subjected to an isotropic etching so that the polysilicon or amorphous silicon remains only in the gap. A second conductivity type epitaxial base layer is selectively grown on the shown surface of the collector layer.

In accordance with the above conventional method, after SIC phosphorus implantation has been made, then the silicon surface is etched to change a distance between the base surface and an n+-type substrate. If the amount of etching is small, then the base width is changed from the intended or designed base width. If the amount of etching is small, then the base width is also changed from the intended or designed base width. High frequency performances or characteristics of the bipolar transistor depend upon the base width, for which reason the change in base width of the bipolar transistor changes the high frequency performances or characteristics of the bipolar transistor.

In the above circumstances, it had been required to develop a novel method of forming a semiconductor device having a bipolar transistor free from variations of high frequency performances or characteristics by suppressing variations of a base width.

SUMMARY OF THE INVENTION

Accordingly, it is an object of the present invention to provide a novel method of forming a semiconductor device having a bipolar transistor free from the above problems.

It is a further object of the present invention to provide a novel method of forming a semiconductor device having a bipolar transistor free from variations of high frequency performances or characteristics.

It is a still further object of the present invention to provide a novel method of forming a semiconductor device having a bipolar transistor by suppressing variations of a base width.

In accordance with the above first embodiment of the present invention, after a base polysilicon film has been grown, a lump anneal is carried out because of an extremely small variation to the silicon dioxide film. Subsequently, a buffered fluorine acid is used which has a large selective etching ratio of the silicon oxide film to the polysilicon film to side-etch the silicon oxide film in the horizontal direction by a predetermined width before the base impurity $BF^2+$ is implanted and then the emitter polysilicon film is formed. For those reasons, a variation in distance between the n+-substrate and a collector is small. The base width "WB" of the base region is not varied, whereby variations in high frequency performance of the bipolar transistor are suppressed.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a method of forming a bipolar transistor. The method comprises the steps of: selectively etching laminations of a base polysilicon film and an insulation film overlying the base polysilicon film to form an opening on an intrinsic base region, wherein the laminations extends on a first silicon oxide film which further extends on an epitaxial layer, so that an upper surface of the first silicon oxide film is shown on the intrinsic base region ; carrying out a first ion-implantation of first impurity ions into the epitaxial layer on the intrinsic base region and under the opening to selectively form a collector in the epitaxial layer; carrying out an isotropic etching to the first silicon oxide film to selectively remove the first silicon oxide film under the opening and also under adjacent portions of the laminations to the opening, thereby forming a gap under the adjacent portions of the laminations; entirely forming a dummy polysilicon film which extends over the laminations and on the side walls and a bottom of the opening as well as extends to fill the gap, so that the dummy polysilicon film has a gap-filling part in the gap; carrying out a heat treatment to oxidize the dummy polysilicon film except for the gap-filling parts, so that the dummy polysilicon film is made into a dummy silicon oxide film except for the gap-filling part; removing the dummy silicon oxide film to leave the gap-filling part in the gap; carrying out a second ion-implantation of second impurity ions through the opening to form a base region under the opening and also over the collector; selectively forming an emitter polysilicon film having an impurity within and over the opening so that a bottom of the emitter polysilicon film is made into contact with a top surface of the base region; and carrying out a heat treatment to cause a thermal diffusion of the impurity in the emitter polysilicon film to an upper region of the base region so as to form an emitter in the upper region of the base region.

It is possible to further comprise the steps of: after the dummy silicon oxide film is removed, further forming a thin silicon oxide film on a bottom and side walls of the opening, so that the second ion-implantation is then carried out.

It is possible to further comprise the steps of: after the base region is formed by the second ion-implantation, further forming side wall insulation layers on the side walls of the opening and also removing the thin silicon oxide film on the bottom of the opening before the emitter polysilicon film is formed.

PREFERRED EMBODIMENT

A first embodiment according to the present invention will be described in detail with reference to the drawings. FIGS. 1A through 1K are fragmentary cross sectional elevation views illustrative of semiconductor devices with bipolar transistors in sequential steps involved in a novel method of forming the same in a first embodiment in accordance with the present invention.

Figure 1A:
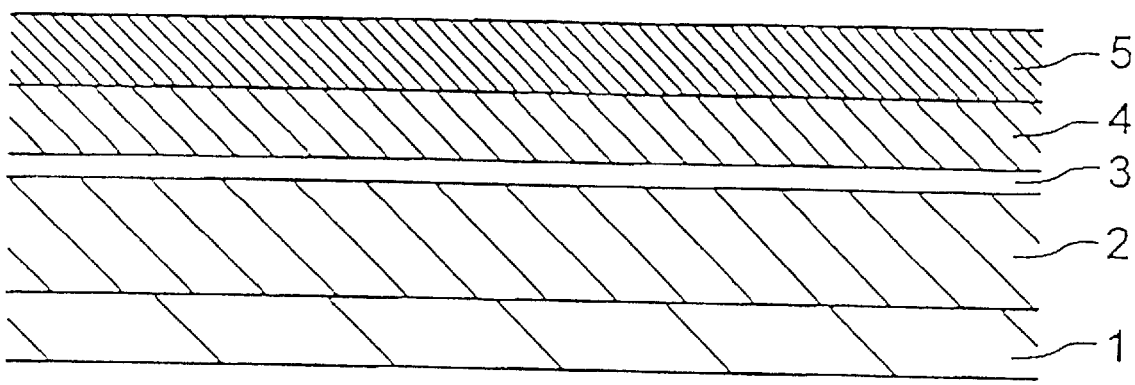
FIGS. 1A through 1K are fragmentary cross sectional elevation views illustrative of semiconductor devices with bipolar transistors in sequential steps involved in a novel method of forming the same in a first embodiment in accordance with the present invention.

With reference to FIG. 1A, an $n^-$-type epitaxial layer 2 is epitaxially grown on an n+-type semiconductor substrate 1, so that the $n^-$-type epitaxial layer 2 has a thickness in the range of 0.5 micrometers to 2 micrometers and also has a receptivity in the range of 0.5 ohms cm to 3 ohms cm. A first oxide film as a field oxide film not illustrated and having thickness of about 1 micrometer is selectively formed on a passive region other than an active region or a device region. Concurrently, a silicon dioxide film 3 is also formed on the $n^-$-type epitaxial layer 2. A base polysilicon film 4 having a thickness in the range of 1000 angstroms to 2000 angstroms is formed on the silicon dioxide film 3. An ion-impurity such as boron is ion-implanted into the base polysilicon film 4 in order to reduce a resistivity of the base polysilicon film 4. A first silicon nitride film 5 having a thickness of about 2000 angstroms is formed on the base polysilicon film 4.

Figure 1B:
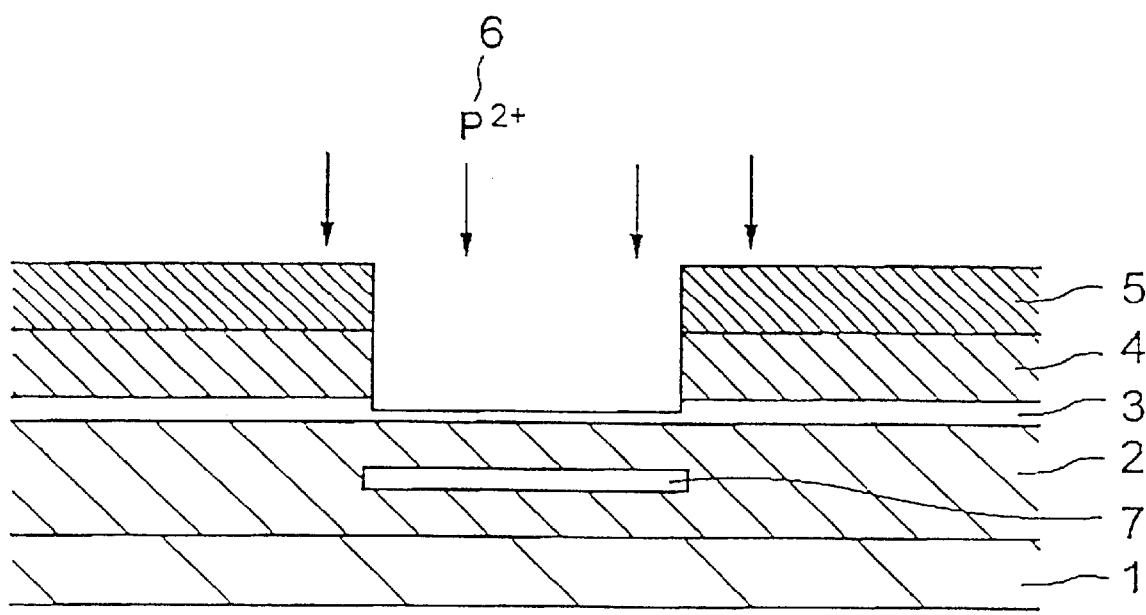

With reference to FIG. 1B, a photo-resist pattern not illustrated is formed on the first silicon nitride film 5 by a photo-resist technique, wherein the photo-resist pattern has an opening which is positioned on an intrinsic base region. An anisotropic etching process is carried out by use of the photo-resist pattern, so as to selectively remove the first silicon nitride film 5 and the base polysilicon film 4 only on the intrinsic base region. The silicon dioxide film 3 on the intrinsic base region is slightly etched by the anisotropic etching process by an etched-amount or thickness in the range of 200 angstroms to 300 angstroms. Since the thickness of the silicon dioxide film 3 is about 1 micrometer, the remaining part of the silicon dioxide film 3 well covers the surface of the epitaxial layer 2. An ion-implantation process is carried out of phosphorus ions 6 into the intrinsic base region and a peripheral region of the intrinsic base region at an acceleration energy in the range of 300–400 KeV at a dose in the range of 1E12 /cm2 to 1E13/cm2, whereby the phosphorus ions 6 are implanted through the remaining region of the silicon dioxide film 3 on the intrinsic base region into an intermediate depth region of the epitaxial layer 2 on the intrinsic base region. As a result, an n+-type SIC collector region 7 is selectively formed in the epitaxial layer 2. The n+-type SIC collector region 7 has an intermediate depth of the epitaxial layer 2, so that the n+-type SIC collector region 7 lies below the top surface of the epitaxial layer 2 and above the bottom surface of the epitaxial layer 2.

Figure 1C:
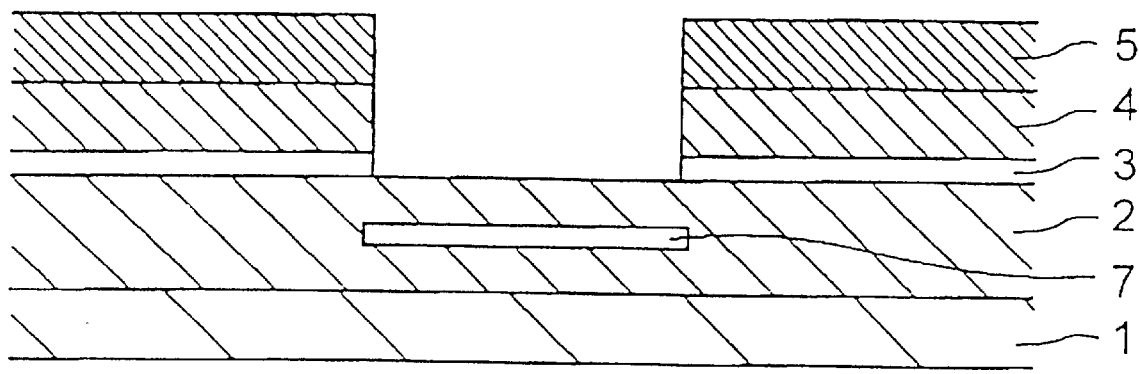

With reference to FIG. 1C, the used photo-resist is removed. The remaining part of the silicon dioxide film 3 on the intrinsic base region is then removed by an isotropic etching process, whereby the top surface of the epitaxial layer 2 is selectively shown on the intrinsic base region.

Figure 1D:
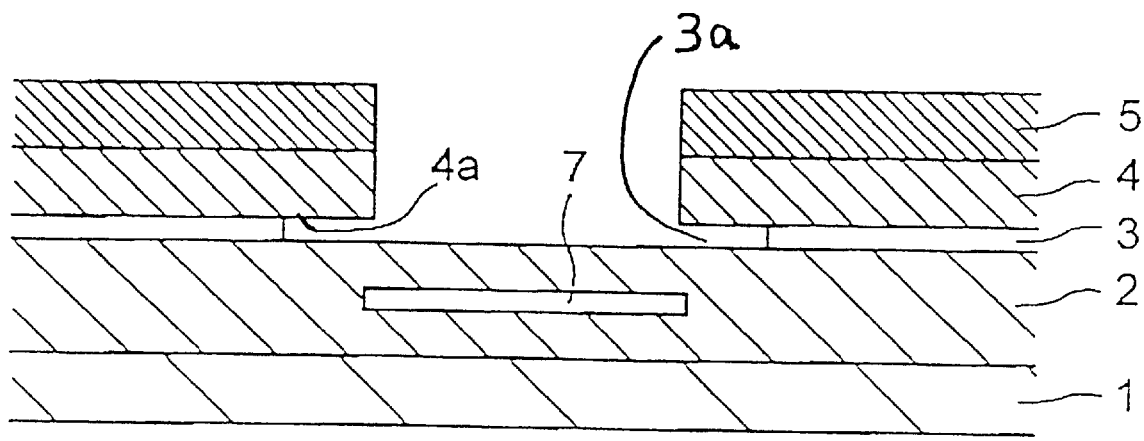

With reference to FIG. 1D, the isotropic etching process to the silicon dioxide film 3 is continued to side-etch the silicon dioxide film 3 in the horizontal directions so that horizontally projecting parts 4a of the base polysilicon film 4 are formed and gaps 3a are formed under the horizontally projecting parts 4a of the base polysilicon film 4, whereby the gaps 3a have the same level as the silicon dioxide film 3 and are positioned on peripheral regions of the intrinsic base region.

Figure 1E:
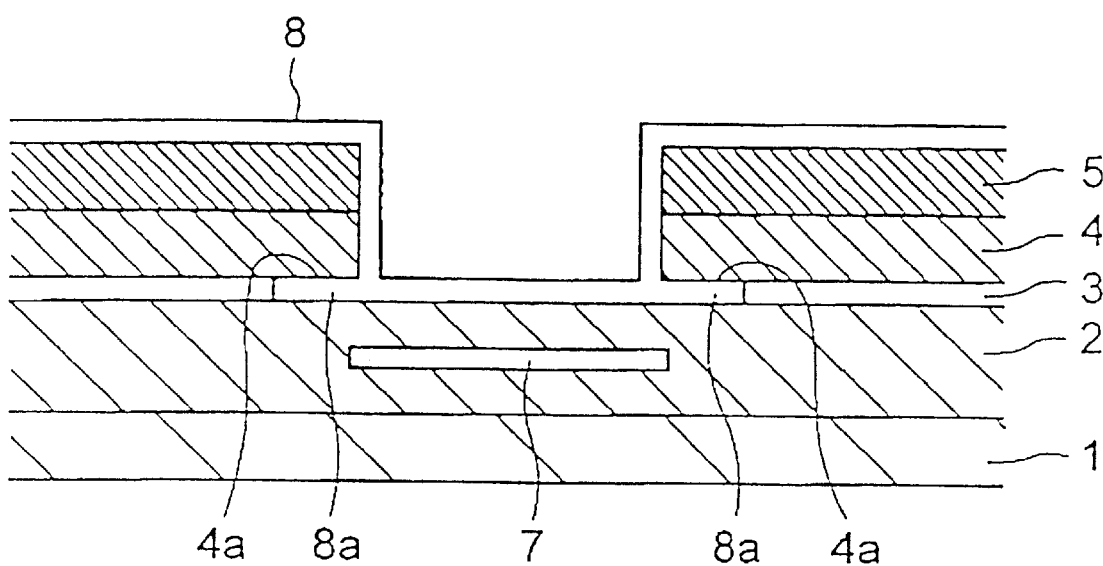

With reference to FIG. 1E, a polysilicon film 8 is entirely formed which extends on the shown top surface of the epitaxial layer 2 and on side walls of the laminations of the base polysilicon film 4 and the silicon nitride film 5 as well as on the top surface of the silicon nitride film 5, so that the gaps 3a positioned under the horizontally projecting parts 4a of the base polysilicon film 4 are filled with gap-filling polysilicon layers 8a of the polysilicon film 8. The polysilicon film 8 has a thickness of 400 angstroms.

Figure 1F:
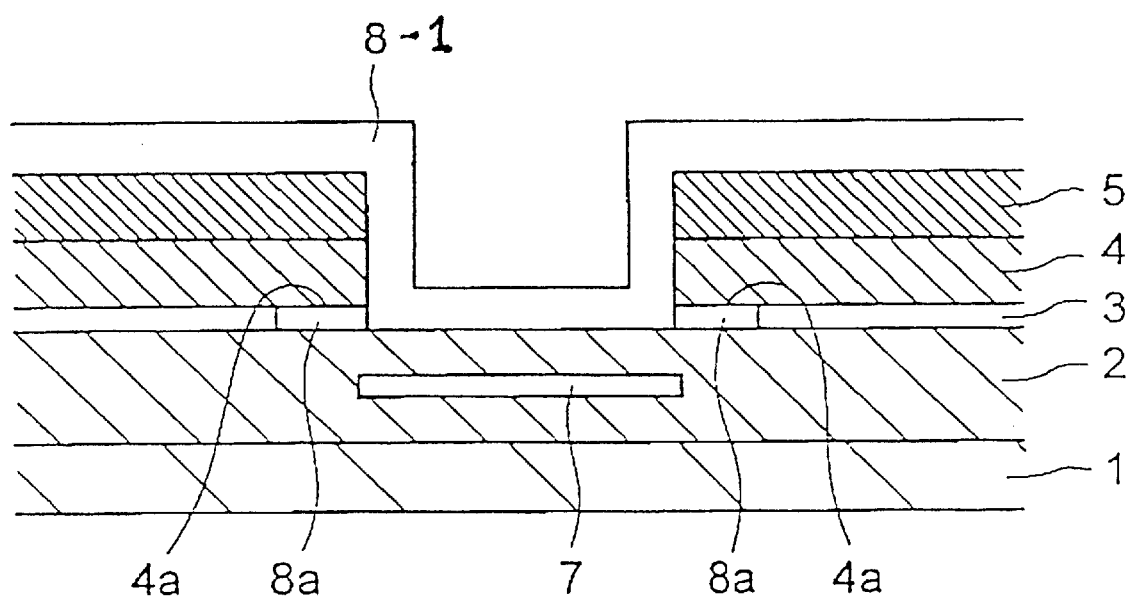

With reference to FIG. 1F, a lamp anneal is carried out at a temperature of 1050° C. for 30 seconds in an oxygen atmosphere to subject the polysilicon film 8 to an oxidation, whereby the polysilicon film 8 except for gap-filling polysilicon layers 8a is made into a silicon oxide film 8-1. Namely, the gap-filling polysilicon layers 8a remain, which fill the gaps 3a under the horizontally projecting parts 4a of the base polysilicon film 4. The lamp anneal causes a thermal diffusion of the impurity in the base polysilicon film 4 to the gap-filling polysilicon layers 8a, thereby reducing the resistivity of the gap-filling polysilicon layers 8a.

Figure 1G:
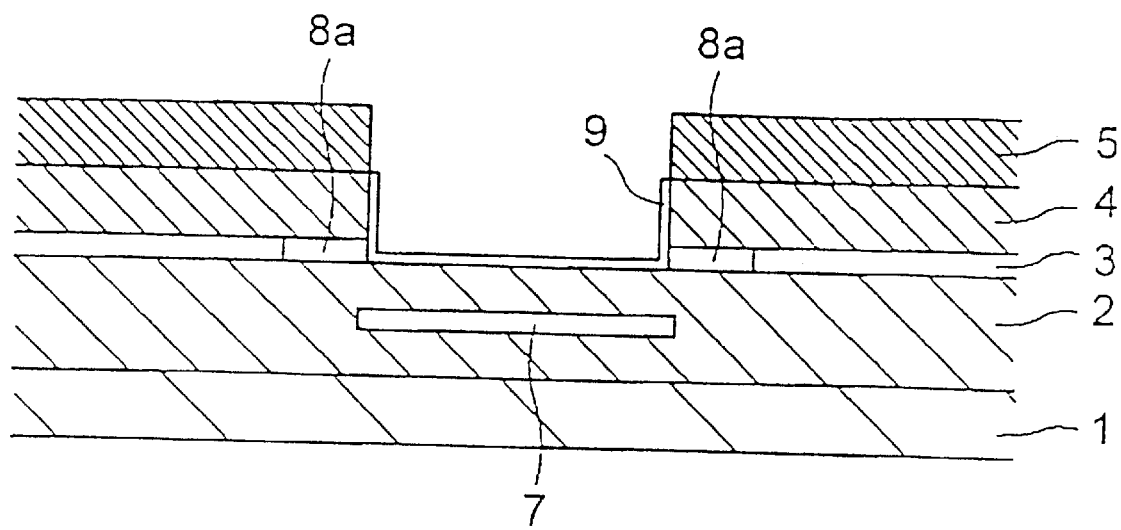

With reference to FIG. 1G, as described above, the polysilicon layer 8 has extended on the top surface of the epitaxial layer 2 in the intrinsic base region and on the side walls of the laminations of the base polysilicon film 4 and the silicon nitride film 5 as well as on the top surface of the silicon nitride film 5. The polysilicon layer 8 is removed by a diluted fluorine acid solution, whereby the top surface of the epitaxial layer 2 in the intrinsic base region and the side walls of the laminations of the base polysilicon film 4 and the silicon nitride film 5 as well as the top surface of the silicon nitride film 5 and side edges of the gap-filling polysilicon layers 8a are shown. A silicon dioxide film 9 having a thickness of 100 angstroms is selectively formed on the shown top surface of the epitaxial layer 2 in the intrinsic base region and on side walls of the base polysilicon film 4, whereby the silicon dioxide film 9 is in contact with side edges of the gap-filling polysilicon layers 8a, whilst the side walls and the top surface of the silicon nitride film 5 remain shown.

Figure 1H:
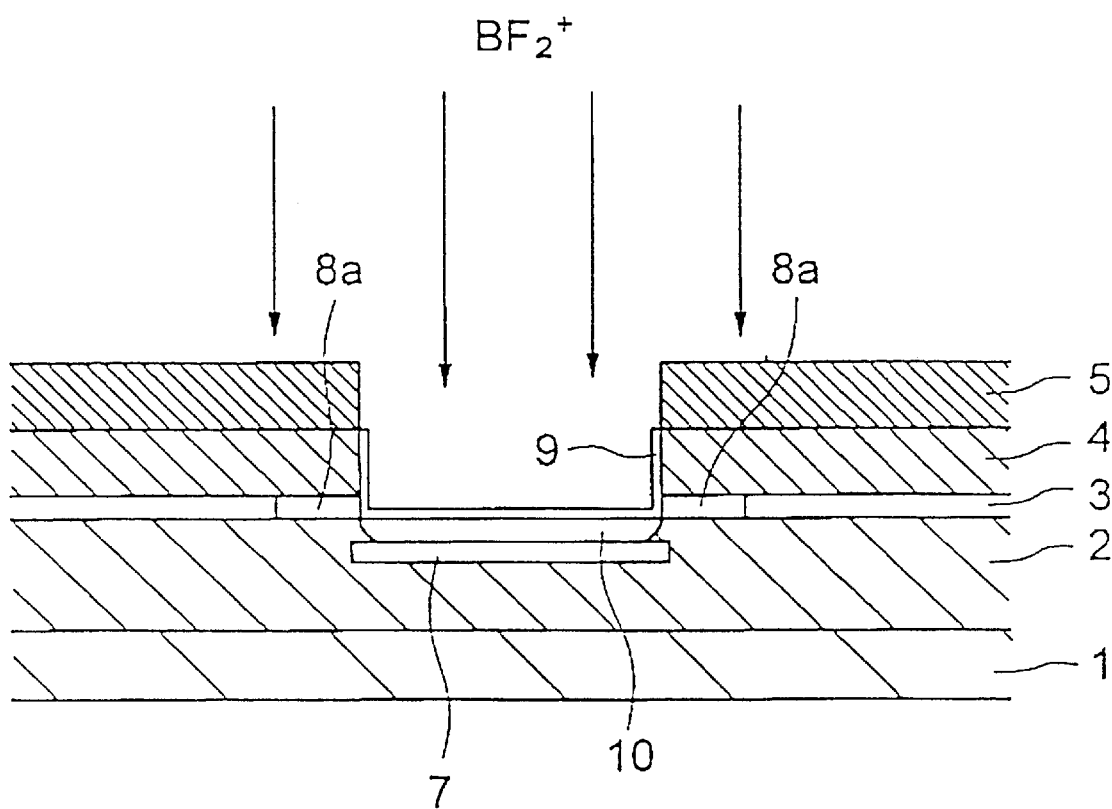

With reference to FIG. 1H, an ion-implantation process is carried out of $BF^{2+}$ ions into the intrinsic base region and a peripheral region of the intrinsic base region at an acceleration energy in the range of 10–30 KeV at a dose in the range of 1E13/cm2 to 5E13/cm2, whereby the $BF^{2+}$ ions are implanted through the silicon dioxide film 9 on the intrinsic base region into an upper region of the epitaxial layer 2 over the n+-type SIC collector region 7 on the intrinsic base region. As a result, a base region 11 is selectively formed in the epitaxial layer 2 over the n+-type SIC collector region 7 and on the intrinsic base region, so that a bottom surface of the base region 11 is in contact with a top surface of the n+-type SIC collector region 7, whilst a top surface of the base region 11 lies the top level of the epitaxial layer 2.

Figure 1I:
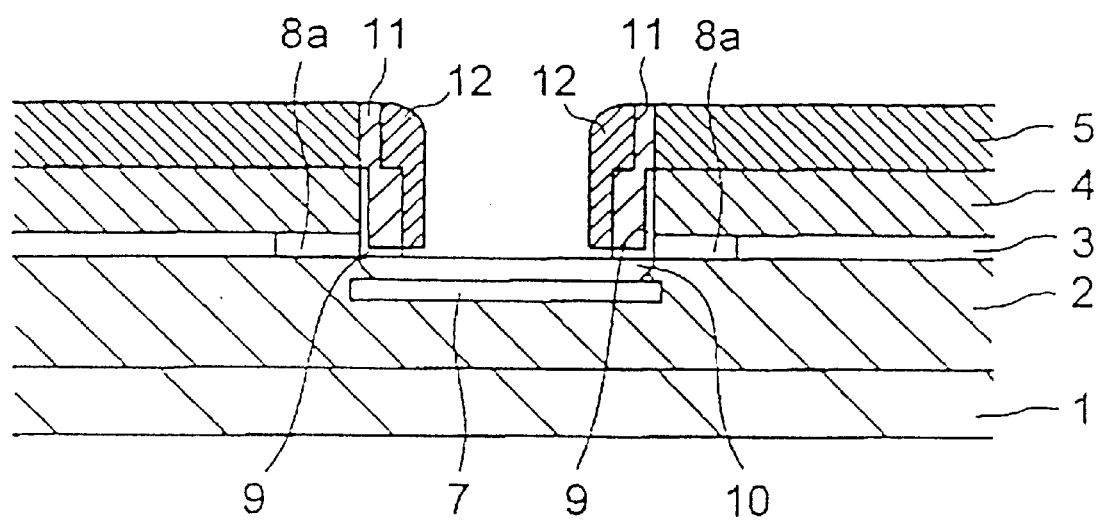

With reference to FIG. 1I, a silicon dioxide film 11 having a thickness in the range of 100 angstroms to 300 angstroms is entirely formed, so that the silicon dioxide film 11 extends on the silicon dioxide film 9, the side walls and the top surface of the silicon nitride film 5. A silicon nitride film 12 having a thickness in the range of 1200 angstroms to 2000 angstroms is also entirely formed on the silicon dioxide film 11. The laminations of the silicon dioxide film 11 and the silicon nitride film 12 as well as the silicon dioxide film 9 are selectively subjected to an etch-back by a dry etching process, so that the laminations of the silicon dioxide film 11 and the silicon nitride film 12 remain on the side walls of the base polysilicon film 4 and the silicon nitride film 5, wherein the silicon dioxide film 9 remains in contact with the silicon dioxide film 11. As a result, double layered side wall oxide films comprising the laminations of the silicon dioxide film 11 and the silicon nitride film 12 are formed on the side walls of the laminations of the base polysilicon film 4 and the silicon nitride film 5. The double layered side wall oxide films are positioned over the intrinsic base region.

Figure 1J:
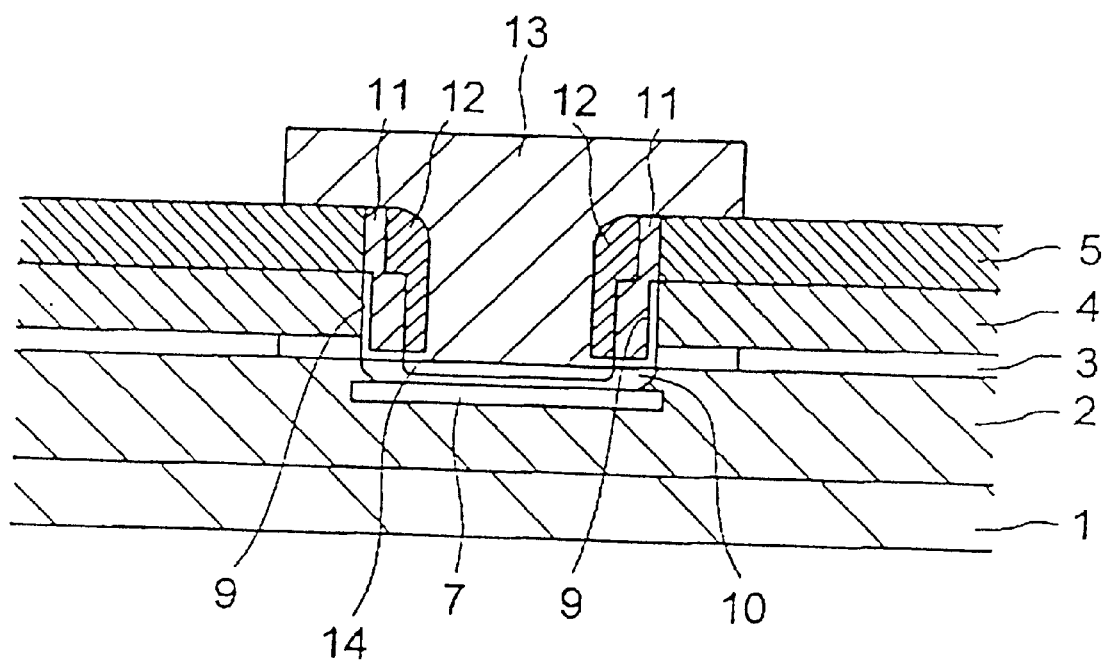

With reference to FIG. 1J, an emitter polysilicon film 13 is selectively formed on the intrinsic base region and the peripheral region of the intrinsic base region by a normal pressure chemical vapor deposition method, so that the emitter polysilicon film 13 extends on the shown top surface of the base region 10 and on the silicon nitride film 12 as well as on the top surfaces of the silicon nitride film 12, the silicon dioxide film 11 and the silicon nitride film 5 on the peripheral region of the intrinsic base region. The emitter polysilicon film 13 has a thickness of 2000 angstroms. An ion-implantation is carried out for implanting arsenic ions toward the base region 10 at an acceleration energy of 60 KeV and at a dose of 1E16/cm2, so that the arsenic ions are implanted into a beep region of the emitter polysilicon film 13 over the base region 10 and on the intrinsic base region. Subsequently, a heat treatment is carried out to cause a thermal diffusion of the arsenic ions into an upper region of the base region 10, wherein the upper region of the base region 10 is in contact with the bottom of the emitter polysilicon film 13. As a result of the thermal diffusion, an emitter region 14 is selectively formed in the upper region of the base region 10. The heat treatment also causes a thermal diffusion of the impurity in the gap-filling polysilicon layers 8a into connective parts 8b of the epitaxial layer 2, wherein the connective parts 8b of the epitaxial layer 2 are positioned directly under the gap-filling polysilicon layers 8a and outside of the base region 10, whereby the connective parts 8b of the epitaxial layer 2 are reduced in resistivity. As a result, the base region 10 is electrically connected through the connective parts 8b and the gap-filling polysilicon layers 8a to the base polysilicon film 4.

Figure 1K:
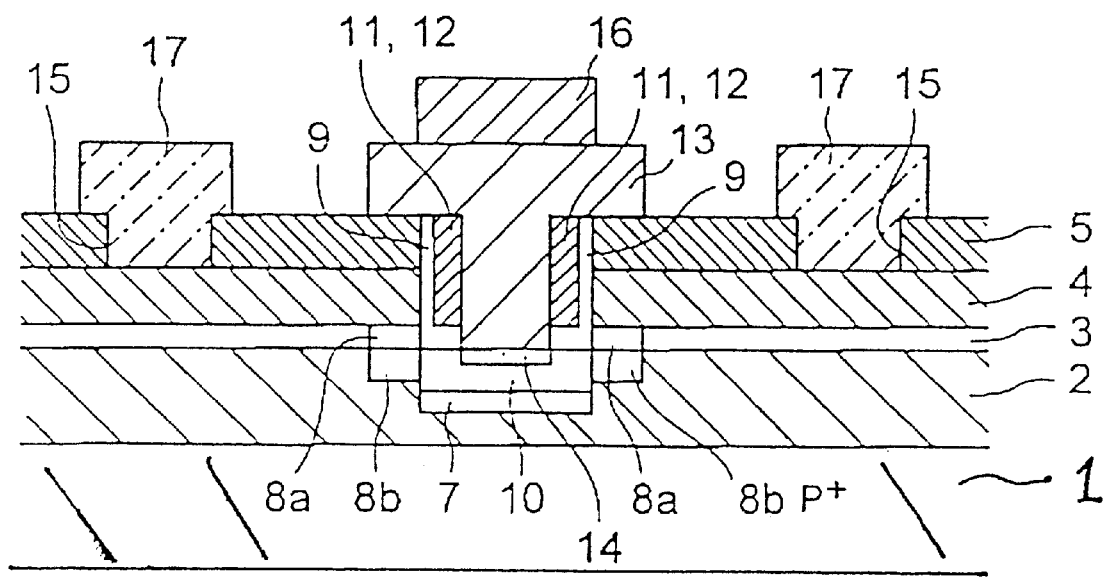

With reference to FIG. 1K, the emitter polysilicon film 13 is patterned by a photolithography technique. Contact holes 15 are then formed in the silicon nitride film 5 by another photolithography technique so that the contact holes 15 reach the top surface of the base polysilicon film 4. An Al—Cl alloy is entirely deposited by a sputtering method so that an Al—Cl alloy layer is formed which extends over the silicon nitride film 5 and the emitter polysilicon film 13 as well as within the contact holes 15, whereby the Al—Cl alloy layer within the contact holes 15 are in contact with the top surface of the base polysilicon film 4. The Al—Cl alloy layer is patterned by a photolithography technique, whereby base electrodes 17 are formed within and over the contact holes 15 as well as an emitter electrode 16 is also formed on the top surface of the emitter polysilicon film 13. The emitter electrode 16 is electrically connected through the emitter polysilicon film 13 to the emitter region 14. The base electrodes 17 are electrically connected through the base polysilicon film 4, the gap-filling polysilicon layers 8a and the connective parts 8b to the base region 10.

Figure 2A:
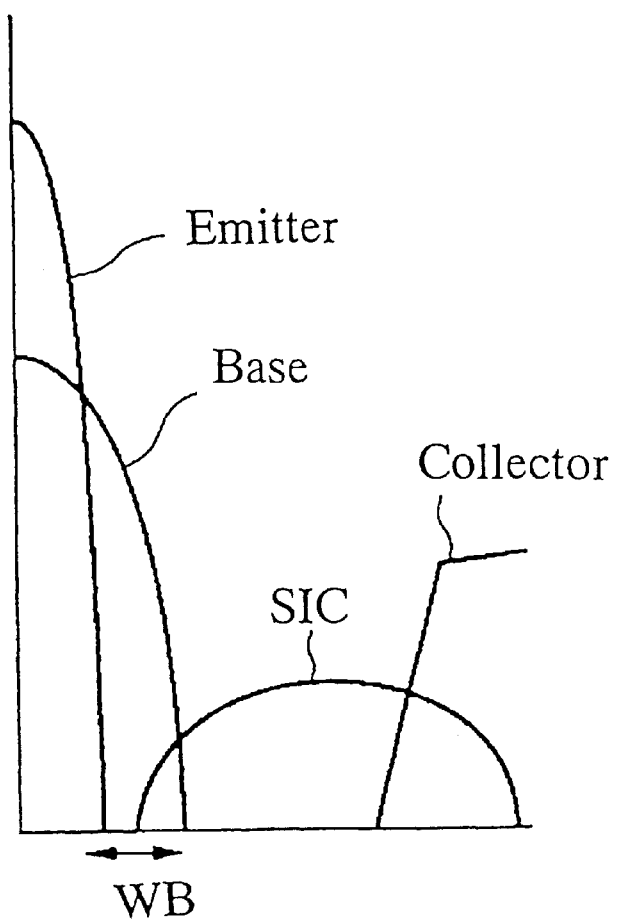
FIG. 2A is a diagram illustrative of an impurity profile of an emitter region, a base region and a collector region of the bipolar transistor formed by the novel fabrication method in accordance with the above first embodiment of the present invention.
Figure 2B:
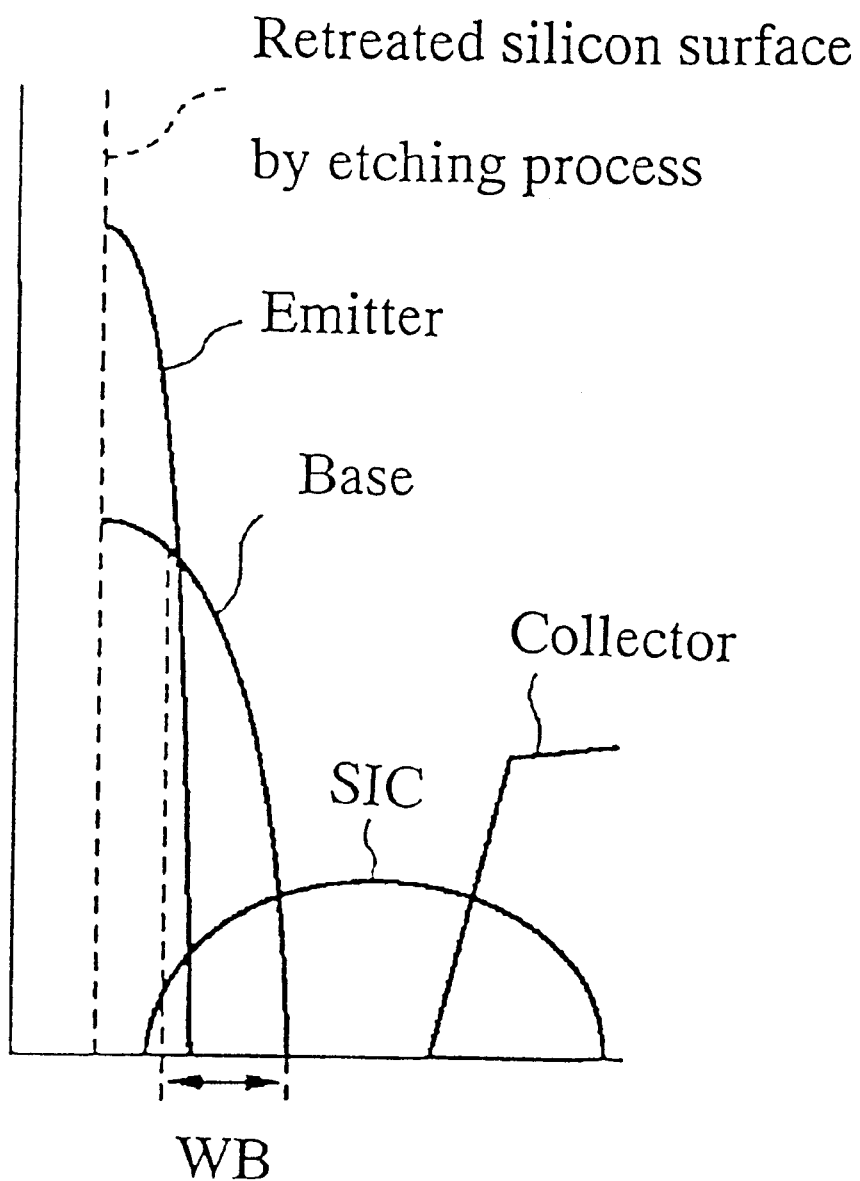
FIG. 2B is a diagram illustrative of an impurity profile of an emitter region, a base region and a collector region of the bipolar transistor formed by the conventional fabrication method.

FIG. 2A is a diagram illustrative of an impurity profile of an emitter region, a base region and a collector region of the bipolar transistor formed by the novel fabrication method in accordance with the above first embodiment of the present invention. FIG. 2B is a diagram illustrative of an impurity profile of an emitter region, a base region and a collector region of the bipolar transistor formed by the conventional fabrication method disclosed in Japanese laid-open patent publication No. 7-307047.

In accordance with the above first embodiment of the present invention, after the base polysilicon film 4 has been grown, the lump anneal is carried out because of an extremely small variation to the silicon dioxide film 3. If the polysilicon film of 400 angstroms in thickness is oxidized in a wafer of five-inches, a variation is about 5 angstroms. Subsequently, a buffered fluorine acid is used which has a large selective etching ratio of the silicon oxide film 3 to the polysilicon film 4 to side-etch the silicon oxide film 3 in the horizontal direction by a predetermined width before the base impurity $BF^{2+}$ is implanted and then the emitter polysilicon film 13 is formed. For those reasons, a variation in distance between the n+-substrate 1 and the n+-SIC collector 7 is small. As shown in FIG. 2A, the base width "WB" of the base region 10 is not varied, whereby variations in high frequency performance of the bipolar transistor are suppressed.

By contrast to the novel method of the present invention, in accordance with the conventional method disclosed in the above Japanese publication No. 7-307047, after the SIC phosphorus ion-implantation process has been carried out, then the silicon surface is etched whereby the distance between the base surface and the n+-type substrate is varied. The base width varies depending upon the amount of etching the silicon surface. The variation in width of the base region causes variation in high frequency performances or characteristics of the bipolar transistor.

For example, a typical high frequency performance or characteristic "fT" of the bipolar transistor is given by the following equation:

$$FT = \tfrac{1}{2}\pi(\tau e + \tau b + \tau c + \tau x)$$

where $\tau e = kTCte/qIc$, $\tau b = WB2/NDn$, $Dn = kT\mu B$, $\tau c = rcs \ast Ccb$, $\tau x = Xs/2vx$, k is the Boatsman constant, T is the absolute temperature, Cte is the emitter capacitance, q is the unit charge of electron, Ic is the collector current, WB is the base width, N is the constant, $\mu B$ is the electron mobility, rcs is the collector resistance, Ccb is the collector capacitance, Xs is the width of collector space charge region, and vx is the traveling saturation speed of the collector space charge region.

If, for example, the amount of etching the silicon surface is changed from 1000 angstroms to 700 angstroms, τb is reduced to about one half. If the amount of etching the silicon surface is changed from 1000 angstroms to 1300 angstroms, τb is increased to 1.7 times. Namely, the variation in amount of etching the silicon surface causes the variation in fT of the bipolar transistor.

By contrast, in accordance with the present invention, the base width is varied within 5 angstroms, almost no variation in fT of the bipolar transistor is caused. Namely, the present invention provides the effect of suppression to variation of the base width whereby almost no variation in high frequency performance is caused.

The above first embodiment of the present invention may be applicable to the PNP bipolar transistor.

The above first embodiment of the present invention may be applicable to the bipolar transistor, wherein the epitaxial layer 2 is not provided, whilst the upper surface of the collector 7 lies the top surface o the substrate.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a bipolar transistor, comprising the steps of:

selectively etching laminations of a base polysilicon film and an insulation film overlying said base polysilicon film to form an opening on an intrinsic base region, wherein said laminations extends on a first silicon oxide film which further extends on an epitaxial layer, so that an upper surface of said first silicon oxide film is shown on said intrinsic base region;

carrying out a first ion-implantation of first impurity ions into said epitaxial layer on said intrinsic base region and under said opening to selectively form a collector in said epitaxial layer;

carrying out an isotropic etching to said first silicon oxide film to selectively remove said first silicon oxide film under said opening and also under adjacent portions of said laminations to said opening, thereby forming a gap under said adjacent portions of said laminations;

entirely forming a dummy polysilicon film which extends over said laminations and on said side walls and a bottom of said opening as well as extends to fill said gap, so that said dummy polysilicon film has a gap-filling part in said gap;

carrying out a heat treatment to oxidize said dummy polysilicon film except for said gap-filling parts, so that said dummy polysilicon film is made into a dummy silicon oxide film except for said gap-filling part;

removing said dummy silicon oxide film to leave said gap-filling part in said gap;

carrying out a second ion-implantation of second impurity ions through said opening to form a base region under said opening and also over said collector;

selectively forming an emitter polysilicon film having an impurity within and over said opening so that a bottom of said emitter polysilicon film is made into contact with a top surface of said base region; and carrying out a heat treatment to cause a thermal diffusion of said impurity in said emitter polysilicon film to an upper region of said base region so as to form an emitter in said upper region of said base region.

2. The method as claimed in claim 1, further comprising the steps of:

after said dummy silicon oxide film is removed, further forming a thin silicon oxide film on a bottom and side walls of said opening, so that said second ion-implantation is then carried out.

3. The method as claimed in claim 2, further comprising the steps of:

after said base region is formed by said second ion-implantation, further forming side wall insulation layers on said side walls of said opening and also removing said thin silicon oxide film on said bottom of said opening before said emitter polysilicon film is formed.

* * * * *